POWER AMPLIFIER FOR AMPLITUDE MODULATED TRANSMITTER

Filed Feb. 7, 1968 2 Sheets-Sheet 1

INVENTOR
DIETER R. LOHRMANN.

BY Gordon W. Kerr
Harry M. Saragovitz,
Edward J. Kelly & Herbert Berl
ATTORNEYS.

POWER AMPLIFIER FOR AMPLITUDE MODULATED TRANSMITTER

Filed Feb. 7, 1968 2 Sheets-Sheet 2

INVENTOR.
DIETER R. LOHRMANN.

BY Gordon W. Kerr
Harry M. Saragovitz,
Edward J. Kelly & Herbert Berl
ATTORNEYS.

3,486,128
POWER AMPLIFIER FOR AMPLITUDE MODULATED TRANSMITTER

Dieter R. Lohrmann, Eatontown, N.J., assignor to the United States of America as represented by the Secretary of the Army Filed Feb. 7, 1968, Ser. No. 703,729
Int. Cl. H03f 3/24
U.S. Cl. 330—40 4 Claims

ABSTRACT OF THE DISCLOSURE

This transistor amplifier includes a circuit for improving the efficiency and linearity thereof by varying the collector electrode supply voltage in synchronism with the difference between the envelope of the input amplitude modulated signal and the attenuated envelope of the output amplitude modulated signal. This difference signal controls a nearly lossless DC transformer which provides a variable collector supply voltage for the amplifier. With this circuitry the collector voltage is automatically reduced during negative portions of the modulation signal to improve the efficiency, and the gain of the transistor varies in such a manner that any distortion in the output thereof caused by transistor non-linearity is cancelled. With a slight modification the circuit can be converted into a high power level modulator.

The invention described herein may be manufactured, used, and licensed by or for the Government for governmental purposes without the payment to me of any royalty thereon.

The present invention relates to a high efficiency power amplifier or modulator particularly adapted for use as the final stage of an amplitude modulated or single sideband transmitter. Since the final stage of any transmitter operates at a much higher power level than any other stage, the overall transmitter efficiency is determined largely by the efficiency of the final stage. Further, the final or power amplifier stage of amplitude modulated (AM) or single sideband (SSB) transmitters are usually operated as class A or AB amplifiers in order to avoid distortion of the signal wave which is changing amplitude at the modulation frequency. The efficiency of such amplifiers is low because the collector or plate electrode voltage must be made large enough to accommodate the largest signal voltage excursion of the collector or plate circuit without substantial distortion. The largest signal voltage excursion occurs at the positive peak of the modulating signal. When the carrier amplitude falls to a low level or zero at the negative peak of the modulating signal, the instantaneous efficiency will decrease, since the instantaneous signal power output is reduced more than is the plate or collector dissipation. According to the concept of the present invention, the collector or plate supply voltage is varied in accordance with the difference between the envelope of the input AM signal and the attenuated envelope of the output AM signal of the amplifier. This supply voltage variation has two effects on the amplifier. It lowers the collector voltage during periods of negative modulating signal to increase the efficiency, and it also reduces distortion in the amplifier by forcing the output signal to follow the envelope of the input signal. The collector or plate voltage is controlled by the difference signal via a substantially lossless DC transformer. It is essential that a substantially lossless means be used to vary the output (collector or plate) electrode supply voltage, otherwise any power saved in the amplifier stage would be consumed in the voltage control circuit. With a slight modification the circuitry may be converted to a high level amplitude modulator.

It is thus an object of the present invention to provide a high-efficiency power amplifier for an amplitude modulated transmitter.

Another object of the invention is to provide a final stage for amplitude modulated transmitters with both increased efficiency and linearity.

These and other objects and advantages of the invention will become apparent from the following detailed description and drawing, in which.

Figure 1:
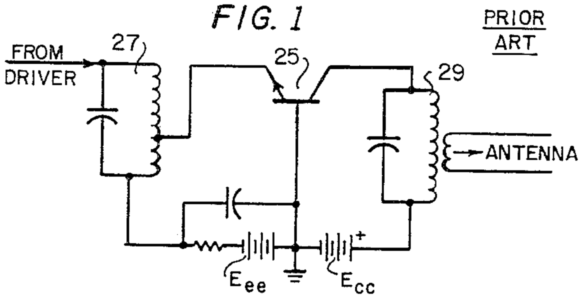
FIGURE 1 is a circuit diagram of a prior art power amplifier and FIGURE 2 is a curve illustrating the operation thereof.
Figure 2:
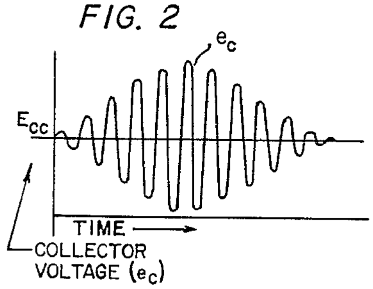

The present invention was developed and will be illustrated in connection with a transistorized amplifier, however the same principles can be applied to vacuum tube-type amplifiers. FIGURE 1 is a simplified circuit diagram of a conventional class A tuned amplifier which has been used as the power amplifier of an AM transmitter. The circuit includes input and output tank circuits 27 and 29. The input is applied from a preceding driver stage and the output is applied to an antenna (not shown). Two fixed voltage sources are included in the circuit. The collector voltage source, E*cc*, must be made larger than the peak amplitude of the AM signal in the output tank circuit 29. This is illustrated in FIGURE 2, which is a curve of the instantaneous collector-to-ground voltage, $e_c$, for one cycle of the modulation voltage of an amplitude modulated carrier wave. As mentioned above, the collector voltage E*cc* must be chosen high enough to accommodate the maximum carrier amplitude in the collector tank circuit. This maximum occurs at the positive peak of the modulation signal. Since the collector dissipation, or power loss, is proportional to the product of the DC collector voltage and current, the high collector voltage, E*cc*, required for linear operation results in high dissipation and hence low efficiency. It can be seen from FIGURE 2 that at the negative peak of the modulation signal the carrier has a small instantaneous amplitude compared to the collector supply voltage.

The efficiency will be improved if the collector supply voltage could be made to vary in accordance with the instantaneous amplitude of the modulating voltage. This could be arranged by automatically raising the collector voltage at positive modulating voltages to accommodate the peak amplitudes of the carrier and by lowering the collector supply voltage at negative modulating voltages to reduce the collector dissipation when the carrier has a small amplitude. Thus the collector supply voltage control circuit must be capable of continually readjusting the collector voltage at the frequency or rate of the highest modulating frequency of the wave being transmitted. This requirement dictates the use of an electronic control circuit where the modulation is of voice frequency or higher. Further, if a dissipative or lossy control circuit is utilized, any saving in power in the transistor collector circuit will be offset by the loss in the control circuit. For example, suppose that a simple potentiometer is inserted across a fixed voltage supply and the slider thereof connected to the collector as a variable supply voltage and somehow varied in accordance with the modulation. If the collector supply of such a circuit is reduced by rotating the potentiometer slider, the power loss in the potentiometer will go up and offset or cancel any power saving at the collector. Thus a voltage control circuit which can be rapidly varied with little or no power loss is required. The circuit of FIGURE 3 includes such circuitry.

Figure 3:
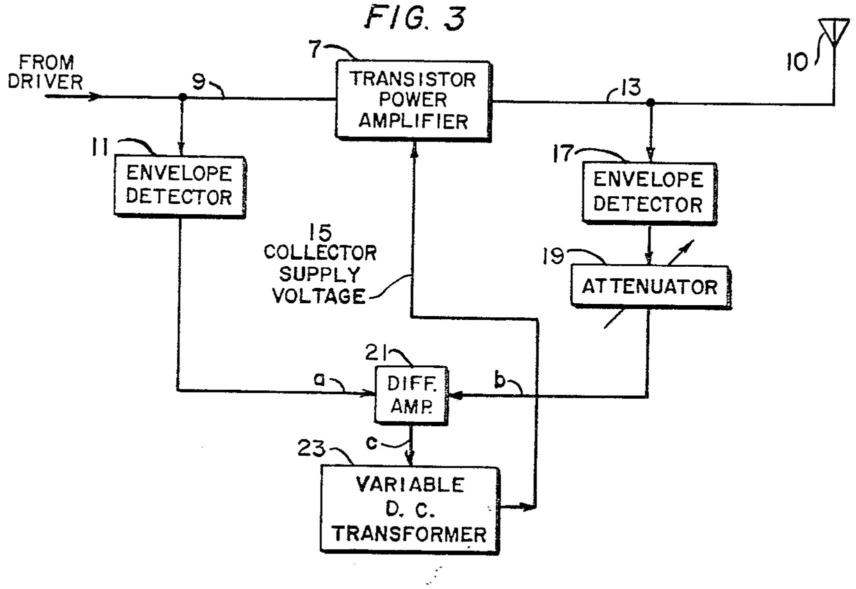
FIGURE 3 is a block diagram of a power amplifier stage of a transmitter which illustrates the concept of the present invention.
Figure 4:
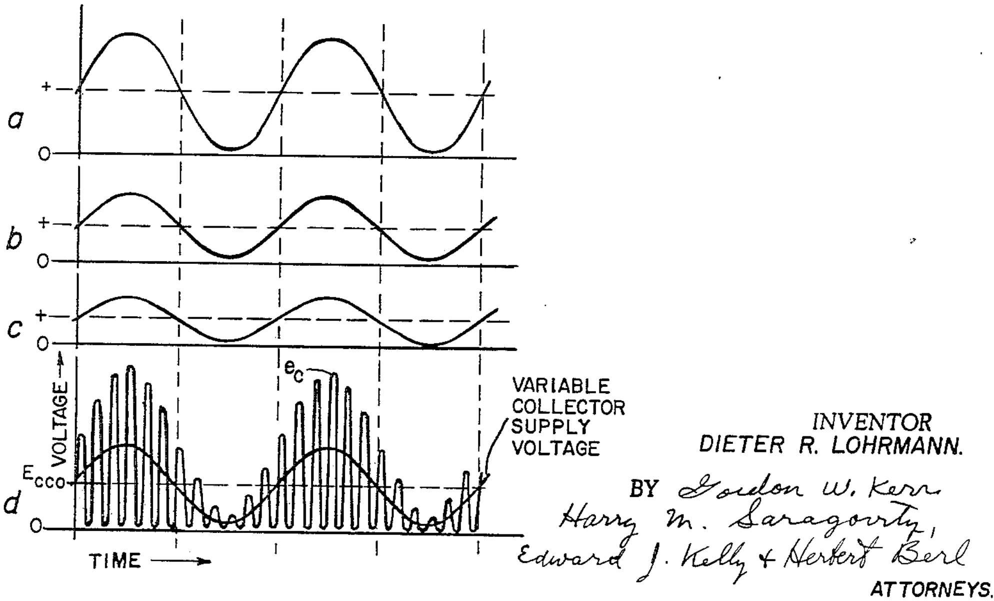
FIGURE 4 is a series of curves illustrating the operation of the circuit of FIGURE 3.

In FIGURE 3 the transistor power amplifier 7 receives its input from a conventional driver, not shown, over lead 9. The amplifier output is radiated from antenna 10. The amplifier 7 receives a variable collector supply voltage from variable DC transformer 23 which functions as the voltage control circuit. The input of the amplifier 7 is an amplitude modulated wave and the envelope detector 11 connected thereto demodulates a portion of this input and applies the modulation thereon to one input of differential amplifier 21 via lead *a*. A second envelope detector 17 is connected to the output lead 13 of the amplifier 7 and recovers the modulation from the amplifier output. The output of detector 17 is passed through variable attenuator 19 and thence to the second input of amplifier 21 via lead *b*. The output of the differential amplifier, *c*, is applied to transformer 23 as the control input thereof. the output of transformer 23 is applied to amplifier 7 as the collector supply over lead 15. The operation of the circuit is as follows: The variable DC transformer is arranged to produce a DC collector supply voltage on lead 15 proportional to the instantaneous voltage at its control input *c*. When a carrier signal is applied from the driver, both envelope detectors will produce outputs, the detector 17 output being the larger due to the gain of the amplifier 7. The attenuator 19 is adjusted to reduce the modulating signal output of 17 so the inputs *a* and *b* of the amplifier 21 are comparable in amplitude, but the input *a* the larger of the two. In the absence of any distortion in the amplifier 7, the waveforms on leads *a* and *b* will both be the same shape. These modulation waveforms are shown in FIGURES 4*a* and 4*b* for a sinusoidal modulation signal, the dashed lines indicating the DC component of the two waveforms. The differential amplifier 21 subtracts its *b* input from its *a* input to yield the difference therebetween at its output *c*, the waveform of which is shown in FIGURE 4*c*. In the absence of distortion this waveform *c* will have the same shape as the modulation at both the input and output of amplifier 7. The control signal on lead *c* varies the output of the transformer 23 in accordance with its instantaneous amplitude. Thus the collector supply voltage at lead 15 will vary in the same fashion as the waveform of FIGURE 4*c* to provide a higher voltage supply during the positive portions of the modulating voltage and a lower voltage during the negative portions thereof. This is illustrated in FIGURE 4*d*, which is a curve of the instantaneous collector voltage, $e_c$, for the circuit of FIGURE 3. The DC component of collector voltage is labelled as E*cco*. It can be seen that the collector supply voltage varies around the value E*cco* in accordance with the amplitude and polarity of the modulation voltage. It can be seen that $e_c$, the instantaneous collector voltage in FIGURE 4*e*, is closer to zero during the negative portions of the modulation wave than it is in the curve of FIGURE 2. This is the feature which reduces the power dissipation of the collector circuit.

The circuit of FIGURE 3, in addition to improving efficiency, also tends to reduce distortion in the transmitter output. This feature results from the fact that the difference between the detected amplifier input and output is utilized to control the transformer 23. With such an arrangement the output *c* of differential amplifier 21 will differ somewhat in waveform from the modulation at the input 9 of the amplifier 7 if there is distortion in amplifier 7 and the difference will be in such a direction as to modulate the amplifier 7 so that the distortion therein will be reduced. In order to accomplish this distortion reduction or linearization, the amplifier 7 must be designed so that the gain varies directly with the collector supply voltage, as is the case with plate-modulated vacuum tube modulators. This distortion-correction feature permits the use of an amplifier 7 which per se is nonlinear. Such amplifiers usually have higher power gain and higher efficiency than when operated in the linear region, and hence the circuit of FIGURE 3 permits higher linear power output than would be the case without the linearization feature thereof.

Figure 5:
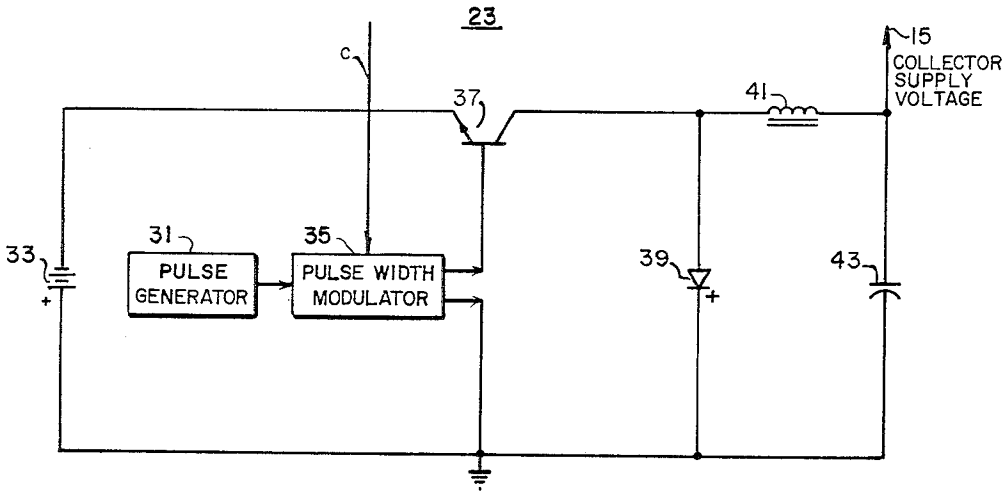
FIGURE 5 is a circuit diagram of the variable DC transformer of FIGURE 3.

The DC transformer (or variable voltage control device) 23 may take the form of the circuit of FIGURE 5. This circuit includes a battery 33 connected between the emitter of transistor 37 and ground. A choke coil 41 and capacitor 43 are connected in series from the transistor collector to ground, with the output lead 15 connected to the junction thereof. A diode 39 shunts both the choke and capacitor. A pulse generator 31 is connected to a pulse width modulator 35 which in turn has its output connected between the base of transistor 37 and ground. The modulation input to the pulse width modulator is the lead *c*, which is the output of the differential amplifier 21 of FIGURE 3. The pulse width modulator 35, pulse generator and lead *c* function in the same way as equipment used in pulse width modulated transmission systems. The signal on lead *c* varies the width of the pulses at the output of modulator 35 in direct proportion to the instantaneous voltage thereon. The repetition rate of the pulses produced by 35 is determined by the frequency of pulse generator 31. Each pulse from modulator 35 causes transistor 37 to conduct and apply the battery 33 to the series connected choke and capacitor. The choke and capacitor comprise a filter for smoothing the train of pulses applied thereto to a DC voltage. Increasing the width of the pulses applied to the transistor base will increase the DC voltage output at lead 15 and decreasing the pulse width will have the opposite effect. Thus the output of transformer 23 will follow the input at lead *c*. The pulse repetition rate of generator 31 is made high enough so that the pulses applied to the choke-capacitor filter can be easily smoothed out to a substantially steady DC voltage. The diode 39 damps out any self-induced voltage spikes generated in the choke 41. It can be seen that there is little loss in the DC transformer of FIGURE 5. The DC voltage drop in the choke 41 can be made very small by minimizing the resistance of its winding. The only other source of loss is the transistor, which is substantially a short circuit when conducting. It is to be noted that the circuit of FIGURE 5 per se is not novel, but its combination with the other circuitry of FIGURE 3 is novel and advantageous, for the reasons stated above.

Figure 6:
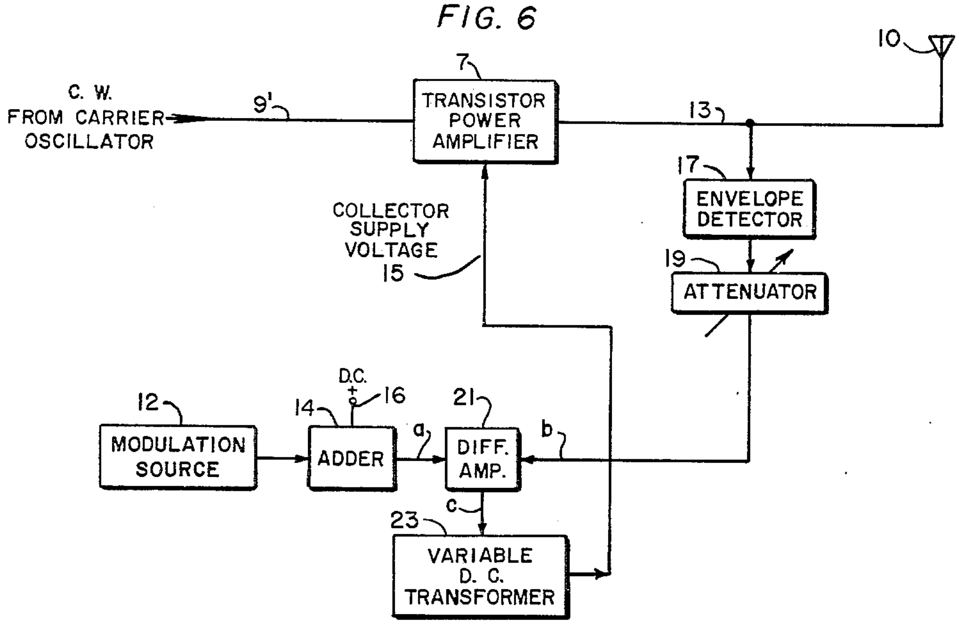
FIGURE 6 is a block diagram of a modification of FIGURE 3.

FIGURE 6 shows how the circuit of FIGURE 3 can be coverted into an amplitude modulator with only slight modification. In this circuit, the envelope detector 11 of FIGURE 3 is omitted and an unmodulated CW signal is applied to the input of amplifier 7 via lead 9'. The input *a* of differential amplifier 21 is the output of adder 14, the two inputs of which are the output of modulation source 12 and DV voltage source 16. The signal at *a* is thus the alternating modulation signal of 12 with a DC component added thereto, which is the same as the corresponding signal of FIGURE 3. The remainder of the circuitry is the same as that of FIGURE 3 and functions in the same way to yield high efficiency and linear, distortion-free operation.

While the invention has been described in connection with an illustrative embodiment, obvious modifications thereof will occur to those skilled in the art.

What is claimed is:

1. A transmitter of amplitude modulated signals comprising; a transistorized power amplifier stage, the output of said power amplifier being taken from the collector electrode thereof, means to apply an amplitude modulated wave to the input of said power amplifier, a first envelope detector connected to the input of said power amplifier and a second envelope detector connected to the output thereof, a variable attenuator connected to the output of said second envelope detector, a differential amplifier having as its inputs the output of said attenuator and the output of said first envelope detector, a substantially lossless DC transformer having its output arranged to supply a variable collector supply voltage to said power amplifier, said transformer having its control input connected to the output of said differential amplifier, and wherein said attenuator is adjusted so that the output thereof is less than the output of said first envelope detector.

2. The transmitter of claim 1 wherein said transformer comprises a source of direct current voltage, an output terminal, means to periodically connect said battery to said output terminal via a transistor and a choke coil in series, said transistor being periodically rendered conductive by means of a train of pulses applied thereto, the width of each of said pulses being determined by the voltage applied to said control input from said differential amplifier.

3. A transmitter of amplitude modulated signals comprising: a transistorized power amplifier stage, the output of said power amplifier being taken from the collector electrode thereof, means to apply an unmodulated carrier wave to the input of said power amplifier, an envelope detector connected to the output of said power amplifier, a variable attenuator connected to the output of said envelope detector, a differential amplifier, the two inputs of which are the output of said attenuator and a modulation signal with a direct current component, a substantially lossless DC transformer having its output arranged to supply a variable collector supply voltage to said power amplifier, said transformer having its control input connected to the output of said differential amplifier.

4. The transmitter of claim 3 wherein said transformer comprises a source of direct current voltage, an output terminal, means to periodically connect said battery to said output terminal via a transistor and a choke coil in series, said transistor being periodically rendered conductive by means of a train of pulses applied thereto, the width of each of said pulses being determined by the voltage applied to said control input from said differential amplifier.

References Cited

UNITED STATES PATENTS

| | | | |
|---|---|---|---|
| 2,705,775 | 4/1955 | Crosby | 332—37 X |
| 3,200,336 | 8/1965 | Valakos et al. | 332—37 X |
| 3,335,370 | 8/1967 | Wittig et al. | 332—59 X |

ROY LAKE, Primary Examiner

J. B. MULLINS, Assistant Examiner

U.S. Cl. X.R.

330—29; 332—37